United States Patent [19]

Morishita et al.

[11] 4,295,087
[45] Oct. 13, 1981

[54] CHARGE INDICATOR CIRCUIT FOR A BATTERY CHARGING SYSTEM

[75] Inventors: Mitsuharu Morishita; Yoshiyuki Iwaki, both of Himeji, Japan

[73] Assignee: Mitsubishi Denki Kabushiki Kaisha, Tokyo, Japan

[21] Appl. No.: 151,734

[22] Filed: May 20, 1980

[30] Foreign Application Priority Data

Jun. 12, 1979 [JP] Japan .......................... 54/80275[U]

[51] Int. Cl.³ ............................ H02J 7/14; H02J 7/24
[52] U.S. Cl. ....................................... 322/99; 320/48; 320/64
[58] Field of Search ................... 322/28, 99; 320/48, 320/64, 68

[56] References Cited

U.S. PATENT DOCUMENTS

| | | | |
|---|---|---|---|
| 3,217,311 | 11/1965 | Custer et al. | |
| 3,624,482 | 11/1971 | Ruff et al. | 322/99 X |
| 3,656,135 | 4/1972 | Ruff | 322/99 UX |
| 3,764,879 | 10/1973 | Hill | 320/48 |
| 3,959,708 | 5/1976 | Allport et al. | 322/28 X |
| 4,121,146 | 10/1978 | Hill | 320/64 X |
| 4,143,313 | 6/1979 | Arendt | 322/28 |

FOREIGN PATENT DOCUMENTS 2519851 11/1975 Fed. Rep. of Germany ........ 322/99
2607408 8/1977 Fed. Rep. of Germany ........ 322/99

*Primary Examiner*—Robert J. Hickey
*Attorney, Agent, or Firm*—Robert E. Burns; Emmanuel J. Lobato; Bruce L. Adams

[57] ABSTRACT

A charge indicator circuit for a battery charging system is disclosed. The battery charging system comprises an alternator, a rectifier, a voltage regulator, and a battery. The rectifier comprises first and second rectified output terminals and a grounded rectified terminal. The field coil of the alternator is supplied by the second rectified output terminal of the rectifier. The regulator is coupled serially with the field coil and cuts off the field current when the voltage sensed at the second rectified output terminal exceeds a first predetermined level. The charge indicator circuit comprises a serial connection of a diode and an indicator lamp coupled between the second rectified output terminal and the battery, and a detector and switching network coupled between the junction between the lamp and the diode and a ground terminal. The detector and switching network detects the voltage at the second rectified output terminal and when the network senses the voltage at the second rectified output terminal to be less than a second predetermined level, which is set lower than the first predetermined level, the network becomes conductive to energize the lamp, which thus indicates the non-charged state of the battery.

1 Claim, 2 Drawing Figures

CHARGE INDICATOR CIRCUIT FOR A BATTERY CHARGING SYSTEM

BACKGROUND OF THE INVENTION

This invention relates to charge indicator circuits for a vehicular battery charging system which indicate the charged state of the battery by sensing the potential difference between the rectified output voltage of the battery charging alternator and the battery, and which is capable of indicating a non-charged state of the battery even when the field winding of the alternator is disconnected.

Battery charging systems with a conventional charge indicator of this type comprise an alternator driven by an internal combustion engine and having output winding and a field winding, a rectifier having first and second rectified output terminals and a grounded rectified terminal and rectifying the A.C. output from the alternator, a voltage regulator connecting the first or second rectified output terminal of the rectifier with the field winding of the alternator, and a battery charged by the output from the first rectified output terminal of the rectifier. A charge indicator lamp is connected between the second rectified output terminal and the battery through a key switch, and a resistor connects the junction between the second rectified output terminal and the lamp with an earth terminal. The indicator lamp is energized when the voltage at the second rectified output terminal is lower than a predetermined level, thus allowing the current from the battery to flow through the serial circuit formed by the key switch, the lamp, and the resistor.

In these conventional arrangements, however, said resistor must be given a low resistance value to give the indicator lamp sufficient brightness, which fact results in the disadvantage that the load on the second rectified output terminal becomes greater. Thus the initial turn-on speed of the generator at which the predetermined output voltage is reached becomes higher, and when the internal combustion engine driving the alternator is left idling after started, the rotational speed of the generator does not reach the initial turn-on speed causing the battery to be left in the non-charged stage. Also, as the resistance of said resistor is of a small value, the internal losses of the alternator due to the power dissipated from the second rectified output terminal are increased, causing the external output available from the alternator to decrease. Further, the power loss at said resistor generates heat therein causing the overall dimension of the arrangement to become greater, the reliability thereof to be reduced, and the costs of manufacture to increase.

SUMMARY OF THE INVENTION

Accordingly, an object of the present invention is to provide a charge indicator circuit for a battery charging system which can indicate the non-charged state of the battery even when the field exciting circuit is disconnected.

Another object of the present invention is to provide a charge indicator circuit for a battery charging system of the above-mentioned type which indicates the non-charged state of the battery with sufficient brightness while dissipating only a small amount of power.

The battery charging system with which the charge indicator circuit according to the present invention is used, comprises an alternator driven by an internal combustion engine and having a field winding and an output winding, a full-wave rectifier means having first and second rectified output terminals and a grounded rectified terminal and rectifying an A.C. output from the output winding of the generator, a battery charged by the output current from the first rectified output terminal of the rectifier means, a resistor connected between the second rectified output terminal and the grounded rectified terminal of the rectified means, and a voltage regulator means coupled serially with the field winding of the alternator and regulating the output voltage of the alternator to a first predetermined level by conducting and cutting off a current flowing through the field winding of the alternator. The field winding of the alternator is supplied by the output from the second rectified output terminal of the rectifier means through the voltage regulator.

The charge indicator circuit according to the present invention comprises a serial connection of a diode and a charge indicator lamp connected between said second rectified output terminal and said battery through a key switch, said diode having an anode and a cathode coupled to said indicator lamp and said second rectified output terminal respectively, and a detector and switching network which connects a junction between the indicator lamp and the diode with a ground terminal and which detects a voltage at the second rectified output terminal and becomes conductive to energize the indicator lamp upon detecting the voltage at the second rectified output terminal to be less than a second predetermined level, said second predetermined level being lower than said first predetermined level.

BRIEF DESCRIPTION OF THE DRAWINGS

Further objects and advantages of the present invention will become apparent from the following detailed description of the preferred embodiment of the present invention made in comparison with a conventional charge indicator circuit, reference being made to the accompanying drawings, wherein.

In the drawings, like reference numerals designate like or corresponding parts or elements.

DETAILED DESCRIPTION OF THE PREFERRED EMBODIMENT

Figure 1:
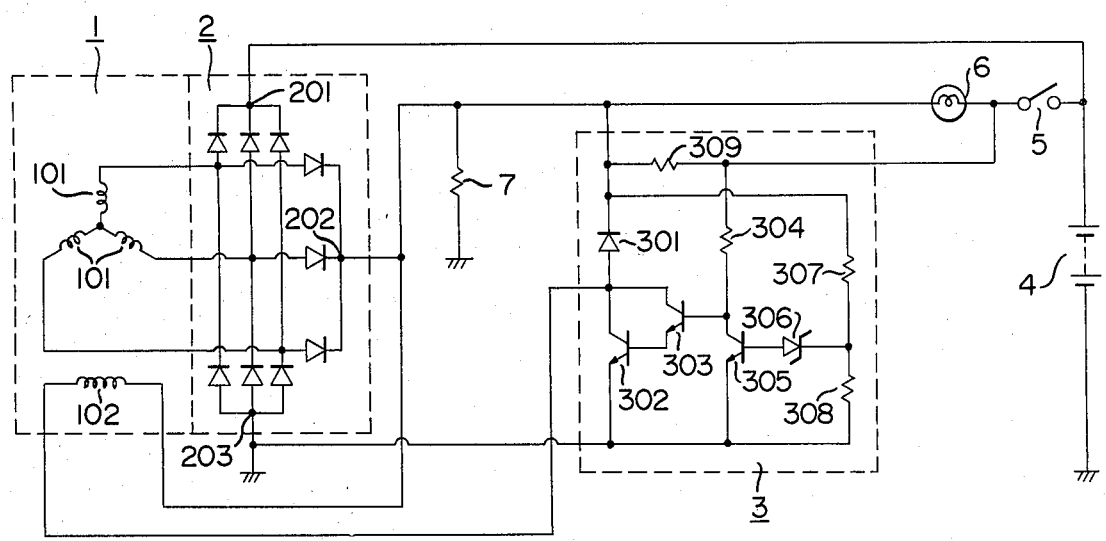
FIG. 1 is a circuit diagram of a battery charging system with a conventional charge indicator circuit.

Referring now to FIG. 1, a description is made of a conventional charge indicator circuit of the above mentioned kind used with a battery charging system. A three phase alternator (1) is driven by an internal combustion engine (not shown) mounted on a motor vehicle (not shown) and comprises a three phase star-connected output coil (101) and a field coil (102). A full-wave rectifier means (2) full-wave rectifies the A.C. output of the alternator (1), and comprises first and second rectified output terminals (201) and (202) and a grounded terminal (203). A voltage regulator means (3) controls the output voltage of the alternator (1) to a predetermined level by controlling the field current flowing through the field coil (102) and comprises a surge absorbing diode (301) connected across the field coil (102), power transistors (302) and (303) which are connected in Darlington connection and conduct and cut off the field current flowing through the field coil (102), a resistor (304) forming the base circuit of said transistors (302) and (303), a control transistor (305) which controls the power transistors (302) and (303) by turning them on and off, a Zener diode (306) which turns on or breaks down when the output voltage of the second rectified output terminal (202) of the alternator (1) reaches a predetermined level, resistors (307) and (308) coupled in series and forming a voltage divider, and an initial exciting resistor (309) connected in parallel with a charge indicator lamp (6) and supplying the initial exciting current to the alternator (1) even when the indicator lamp (6) is disconnected. The system also comprises a battery (4) and a key switch (5).

Now, the operation of the above mentioned device will be described. When, in the first stage, the key switch (5) is closed to start the internal combustion engine, the base current is supplied from the battery (4) to the bases of the power transistors (302) and (303) through the key switch (5) and the resistor (304), and the transistors (302) and (303) are turned on. When the transistors (302) and (303) are turned on, the field current flows through the field coil (102) from the battery (4) through the current path formed by the key switch (5), the parallel connection of the indicator lamp (6) and the resistor (309), the field coil (102), and the transistors (302) and (303), and a magnetomotive force is generated by the field coil (102). At the same time, the current from the battery (4) flows through the resistor (7) through the intermediary of the key switch (5), the indicator lamp (6), and the resistor (309). In this way, the indicator lamp (6) is energized to indicate the non-charged state of the battery (4). Therefore, even when the field coil (102), power transistors (302) and (303), or the wiring constituting a portion of the exciting circuit are disconnected, the charge indicator lamp (6) is energized to indicate the non-charged state of the battery (4).

When the internal combustion engine is started with the battery charging system in this state and begins to drive the alternator (1), an A.C. output is induced in the output coil (101) in proportion to the rotational speed thereof and is rectified by the full-wave rectifier means (2). When the rectified output voltage is lower than a predetermined level and therefore the voltage at the voltage dividing point of the voltage divider formed by the resistors (307) and (308) is not high enough to turn on the Zener diode (306), the field current supply is kept on and the output voltage of the alternator (1) increases in proportion to the rise in the rotational speed thereof. After this stage, when the rotational speed of the alternator (1) is further increased causing the output voltage thereof to exceed said predetermined level, the voltage at the voltage dividing point of said voltage divider becomes sufficiently high to turn on the Zener diode (306), or to cause the Zener diode (306) to break down, and the base current is supplied to the transistor (305) through the Zener diode (306) causing the transistor (305) to turn on. When the transistor (305) turns on, the power transistors (302) and (303) are turned off, cutting off the field current which was flowing through the field coil (102), thereby causing the output voltage of the alternator (1) to decrease.

When the output voltage of the alternator (1) falls to said predetermined level, the Zener diode (306) and the transistor (305) are turned off and the transistors (302) and (303) are turned on to energize the field coil (102), such that the output voltage of the alternator (1) again begins to increase.

Repeating the above-described operation, the output voltage of the alternator (1) is regulated to said predetermined level and thus charges the battery (4) at a voltage controlled to this predetermined level.

When the voltage at the second rectified output terminal (202) is regulated to the predetermined level to have a negligible potential difference with the voltage at the battery (4), the charge indicator lamp (6) is de-energized to indicate the charged state of the battery (4). If in a battery charging system operating in the above described state, the field coil (102), transistors (302) and (303), or the wiring constituting a portion of the field exciting circuit are disconnected, the field current flowing through the field coil (101) is cut off causing the output voltage at the second rectified output terminal to decrease. Thus, the current from the battery (4) flows through the charge indicator lamp (6) by the current path formed by the key switch (5), charge indicator lamp (6), and the resistors (309) and (7) to indicate the non-charged state of battery (4).

In the above-described charge indicator circuit, however, the resistance value of the resistor (7), which is inserted for the purpose of indicating the non-charged state of the battery (4) occurring in the case of a disconnection of a portion of the field exciting circuit, must be made low in order that the charge indicator lamp (6) may have sufficient brightness. For example, in a case where the charge indicator lamp is rated at 12 volts, 3.4 watts, the resistance value of the resistor (7) must be made as low as about 10 ohms. As the resistor (7) acts as a load on the second rectified output terminal (202), the load on the alternator (1) becomes greater as the resistance of the resistor (7) is made smaller, and therefore the initial turn-on speed, necessary in order for the above-mentioned output voltage of the generator (1) to reach said predetermined level upon starting the internal combustion engine, becomes higher. Therefore, when the internal combustion engine is left idling after being started, the rotational speed of the alternator (1) does not reach the initial turn-on speed and the battery (4) is left in the non-charged state. The conventional charge indicator circuit also had the defects that because of the larger amount of power dissipation due to the low resistance value of the resistor (7), the power dissipated from the second rectified output terminal (202) becomes greater, increasing the internal losses of the alternator (1) and decreasing the output power thereof, while increasing the heat generated in the resistor (7) and causing the overall dimensions of the battery charging system to increase, while also decreasing the reliability thereof. Therefore, a battery charging system with the conventional charge indicator circuit also suffered from high cost.

Figure 2:
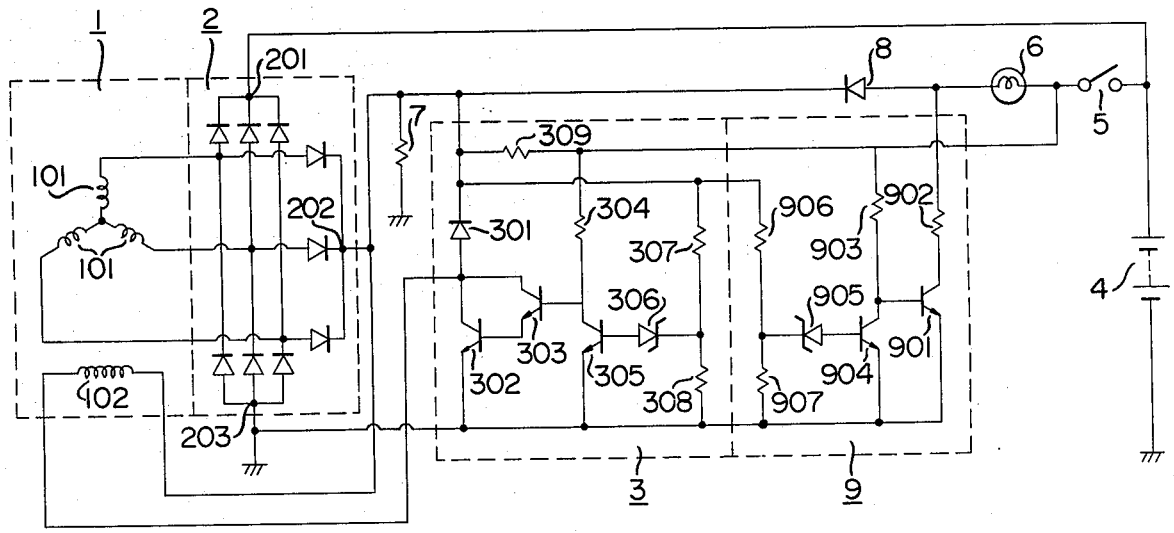
FIG. 2 is a circuit diagram of a battery charging system with a charge indicator circuit according to the present invention.

Referring now to FIG. 2 of the drawings, a description is made of a battery charging system with a charge indicator circuit according to the present invention. The battery charging system of FIG. 2 is largely similar to the one shown in FIG. 1 except for the charge indicator circuit. For those parts similar to the system of FIG. 1, refer to the description of FIG. 1. A diode (8) has an anode and a cathode thereof coupled to a charge indicator lamp (6) and a second rectified output terminal (202) respectively. The detector and switching circuit, or the field exciting circuit disconnection detecting and indicator lamp switching circuit (9) energizes the charge indicator lamp (6) by becoming conductive when the voltage at the second rectified output terminal (202) is lower than a second predetermined level which is lower than a first predetermined level which is determined by the voltage divider circuit formed by the resistors (307) and (308). The detector and switching circuit (9) comprises a transistor (901) which is a switching element coupled through a current limiting resistor (902) between a ground terminal and a junction point between the charge indicator lamp (6) and the diode (8), a resistor (903) coupled to the base of the transistor (901), a transistor (904) controlling the transistor (901) by turning it on and off, a Zener diode (905) constituting a detector element which detects the voltage at the second rectified output terminal (202) of the alternator (1) and is turned on or breaks down when said voltage at the second rectified output terminal (202) reaches the second predetermined level, and resistors (906) and (907) coupled serially and forming a voltage divider circuit.

Now, the operation of the battery charging system with the charge indicator circuit according to the present invention, which is constructed as hereinabove described, is explained. When a key switch (5) is closed upon starting an internal combustion engine (not shown), the field current flows through the field coil (102) from the battery (4) through the current path formed by the key switch (5), the serial connection of the charge indicator lamp (6) and the diode (8) or the resistor (309), the field coil (102), and the transistors (302) and (303) to generate the field magnetomotive force. At this stage, however, as the voltage at the second rectified output terminal (202) is lower than said second predetermined level, the base current is supplied to the transistor (901) from the battery (4) through the key switch (5) and the resistor (903) to turn on the transistor (901). When the transistor (901) turns on, the current from the battery (4) flows through the key switch (5), the charge indicator lamp (6), the resistor (902) and the transistor (901) energizing the charge indicator lamp (6) to indicate the non-charged state of the battery (4). Apart from this case, the charge indicator lamp is also energized to indicate the non-charged state of the battery (4) when the field coil (102), the transistors (302) and (303), or the wiring forming a portion of the field exciting circuit are disconnected, as the voltage at the second rectified output terminal (202), in this case too, becomes lower than the second predetermined level, turning off the Zener diode (905) and the transistor (904) and thus turning on the transistor (901).

When the voltage at the rectified output terminals is regulated to the first predetermined level by the voltage regulator means (3) after the internal combustion engine is started causing the alternator (1) to generate an output voltage, the voltage at the second rectified output terminal (202) is higher than the second predetermined level which is set to be lower than the first predetermined level. Thus, the Zener diode (905) and the transistor (904) are turned on and the transistor (901) is turned off, while the potential difference between the voltages at the second rectified output terminal (202) and the battery (4) becomes negligible, so that the charge indicator lamp (6) is deenergized indicating the charged state of the battery (4). When the field coil (102), transistors (302) and (303), or the wiring forming a portion of the field exciting circuit are disconnected, with the battery charging system in this state, the output voltage at the second rectified output terminal (202) decreases and comes to be lower than the second predetermined level causing the Zener diode (905) and the transistor (904) to turn off and the transistor (901) to turn on. Thus, the charge indicator lamp (6) is energized to indicate the non-charged state of the battery (4). In the embodiment shown in FIG. 2, the resistor (309) is connected between the key switch (5) and the second rectified output terminal (202), but can be coupled in parallel circuit relationship with the charge indicator lamp (6) with the same effect as derived from the embodiment of FIG. 2.

As described hereinabove, in contrast with conventional charge circuits, by setting the second predetermined level of the detector and switching circuit at a suitable value, when a portion of the field exciting circuit is disconnected the charge indicator lamp (6) is grounded through the transistor (901) without the voltage at the second rectified output terminal, which is equal to the voltage at the dividing point of the voltage divider formed by the charge indicator lamp (6) and the resistor (7), being unduly lowered, the charge indicator lamp (6) having sufficient brightness. Thus, the resistor (7) can be made to have a greater resistance, which results in the advantages that the initial turn-on speed of the alternator (1) can be lowered, while the alternator internal losses and the power dissipation of the resistor (7) can be reduced, and that the heat generated in the resistor (7) is reduced, such that the battery charging system can have reduced external dimensions, along with high reliability, and low cost.

What is claimed is:

1. In a battery charging system comprising an alternating current generator having a field winding and an output winding, full-wave rectifier means rectifying an alternating current output of said output winding and having first and second rectified output terminals and a grounded terminal, a battery connected to said first rectified output terminal of said rectifier means to be charged therefrom, a resistor connected between said second rectified output terminal and said grounded terminal of said rectifier means, and voltage regulator means connected serially with said field winding for regulating an output voltage of said generator to a first predetermined level by conducting and cutting off a current flowing through said field winding of said generator, said field winding of said generator being supplied from an output from the second rectified output terminal of said rectifier means through said voltage regulator;

a charge indicator circuit comprising a serial connection of a diode and a charge indicator lamp connected between said second rectified output terminal and said battery through a key switch, said diode having an anode and a cathode connected to said indicator lamp and said second rectified output terminal respectively, a detector and switching network including detecting means for detecting the output voltage of said second output terminal, and switching means which is connected between said anode of said diode and a ground terminal and is turned on by said detecting means to become conductive to energize said indicator lamp when said detecting means detects that the output voltage of said second output terminal becomes less than a second predetermined level which is lower than said predetermined level by a predetermined amount.

* * * * *